United States Patent
Jeong et al.

(10) Patent No.: US 7,115,306 B2
(45) Date of Patent: Oct. 3, 2006

(54) METHOD OF HORIZONTALLY GROWING CARBON NANOTUBES AND DEVICE HAVING THE SAME

(75) Inventors: Soo-hwan Jeong, Gyeonggi-do (KR); Wan-jun Park, Seoul (KR); In-kyeong Yoo, Gyeonggi-do (KR); Ju-hye Ko, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/036,379

(22) Filed: Jan. 18, 2005

(65) Prior Publication Data

US 2005/0188444 A1    Aug. 25, 2005

(30) Foreign Application Priority Data

Feb. 25, 2004 (KR) ............... 10-2004-0012537

(51) Int. Cl.
 *H05H 1/24* (2006.01)
(52) U.S. Cl. ............... 427/577; 427/249.1; 427/309; 423/447.3; 977/DIG. 1
(58) Field of Classification Search ........... 427/577, 427/249.1, 249.6, 301, 309, 903; 423/445 B, 423/447.1, 447.3; 977/DIG. 1
See application file for complete search history.

(56) References Cited

U.S. PATENT DOCUMENTS

| | | | | |
|---|---|---|---|---|
| 5,863,601 A * | 1/1999 | Kikuchi et al. | ............. | 427/200 |
| 6,129,901 A * | 10/2000 | Moskovits et al. | ....... | 423/447.3 |
| 6,278,231 B1 * | 8/2001 | Iwasaki et al. | ............. | 313/310 |
| 6,325,909 B1 * | 12/2001 | Li et al. | ...................... | 205/106 |
| 6,515,339 B1 | 2/2003 | Shin et al. | | |
| 6,628,053 B1 * | 9/2003 | Den et al. | ................... | 313/310 |
| 6,737,939 B1 * | 5/2004 | Hoppe et al. | ................ | 333/186 |
| 6,803,840 B1 * | 10/2004 | Hunt et al. | ................. | 333/186 |
| 6,821,911 B1 * | 11/2004 | Lo et al. | ...................... | 438/780 |
| 2003/0119034 A1 * | 6/2003 | Kang et al. | ..................... | 435/6 |
| 2003/0160556 A1 * | 8/2003 | Choi et al. | ................... | 313/310 |
| 2003/0165418 A1 * | 9/2003 | Ajayan et al. | ........... | 423/447.2 |
| 2004/0043148 A1 * | 3/2004 | Wei et al. | ................ | 427/249.1 |
| 2004/0232426 A1 * | 11/2004 | Graham et al. | ................ | 257/77 |
| 2005/0170089 A1 * | 8/2005 | Lashmore et al. | ....... | 427/248.1 |
| 2005/0276743 A1 * | 12/2005 | Lacombe et al. | ........ | 423/447.3 |

FOREIGN PATENT DOCUMENTS

| | | | |
|---|---|---|---|
| JP | 10-012124 A | * | 1/1998 |
| KR | 2002-003782 A | * | 1/2002 |
| KR | 2002-093270 A | * | 12/2002 |

(Continued)

OTHER PUBLICATIONS

Office Action dated Oct. 31, 2005 issued by the Korean Patent Office and English translation.

*Primary Examiner*—Bret Chen
(74) *Attorney, Agent, or Firm*—Buchanan Ingersoll & Rooney PC

(57) ABSTRACT

Provided are a method of growing carbon nanotubes and a carbon nanotube device. The method includes: depositing an aluminum layer on a substrate; forming an insulating layer over the substrate to cover the aluminum layer; patterning the insulating layer and the aluminum layer on the substrate to expose a side of the aluminum layer; forming a plurality of holes in the exposed side of the aluminum layer to a predetermined depth; depositing a catalyst metal layer on the bottoms of the holes; and growing the carbon nanotubes from the catalyst metal layer.

15 Claims, 3 Drawing Sheets

| | FOREIGN PATENT DOCUMENTS | | WO | WO 02/092505 A2 * 11/2002 |
|----|----|----|----|----|
| KR | 2002-0095800 | 12/2002 | | |
| KR | 2003-0070464 | 8/2003 | | * cited by examiner |

METHOD OF HORIZONTALLY GROWING CARBON NANOTUBES AND DEVICE HAVING THE SAME

BACKGROUND OF THE INVENTION

Priority is claimed to Korean Patent Application No. 2004-12537, filed on Feb. 25, 2004, in the Korean Intellectual Property Office, the disclosure of which is incorporated herein in its entirety by reference.

1. Field of the Invention

The present invention relates to a method of horizontally growing carbon nanotubes (CNTs) and a device having the same, and more particularly, to a method of horizontally growing CNTs of uniform diameter from holes in an alumina template and a device having the same.

2. Description of the Related Art

The electric and mechanical properties of CNTs have been intensively studied to apply to various devices and applications. CNTs can be formed by vertically and horizontally growing methods. CNTs formed using the vertically growing method are used as an electron emission source in a field emission display (FED). Also, such CNTs may be used as a field emission source in a backlight device for a liquid crystal display (LCD), for example.

Horizontally grown CNTs may be applied to inter-connectors, Micro Electro Mechanical System (MEMS) sensors, horizontal field emitter tips, and the like.

In the prior art, an electric field is applied between two electrodes between which a patterned catalyst is interposed so as to horizontally grow CNTs. In such a horizontally growing method, it is not easy to accurately control the magnitude of a catalyst. Thus, it is difficult to uniformly control the diameter of CNTs. Also, yield of the CNTs is low and an electric field must be applied.

U.S. Pat. No. 6,515,339 discloses a method of horizontally growing CNTs from catalysts which are formed in a shape of nanodots, nanowires, or stripes, between which a predetermined space is formed, and on which a vertical growing preventing layer is disposed. However, in this method, it is difficult to uniformly control the diameter of the CNTs.

SUMMARY OF THE INVENTION

The present invention provides a method of horizontally growing CNTs of a predetermined diameter using holes formed in an alumina nano-template.

The present invention provides a CNT device including CNTs which are horizontally grown from holes formed in an alumina nano-template.

According to an aspect of the present invention, there is provided a method of horizontally growing carbon nanotubes, including: depositing an aluminum layer on a substrate; forming an insulating layer over the substrate to cover the aluminum layer; patterning the insulating layer and the aluminum layer on the substrate so as to expose a side of the aluminum layer; forming a plurality of holes in the exposed side of the aluminum layer to a predetermined depth; depositing a catalyst metal layer on the bottoms of the holes; and horizontally growing the carbon nanotubes from the catalyst metal layer.

The aluminum layer is deposited using sputtering or e-beam evaporation.

It is preferable that forming of the plurality of the holes includes dipping the resultant structure of the patterning of the insulating layer and the aluminum layer into a catalyst so as to be anodically oxidized.

It is preferable that depositing of the catalyst metal layer on the bottoms of the holes includes: applying a voltage to a solution selected from the group consisting of a metal sulfate solution, metal chloride solution, and a metal nitrate solution to form the catalyst metal layer.

It is preferable that the catalyst metal layer is formed of a metal selected from the group consisting of Ni, Fe, and Co.

It is preferable that the carbon nanotubes be grown from the catalyst metal layer using a gas containing carbon by a thermal chemical vapor deposition or a plasma enhanced chemical vapor deposition.

According to another aspect of the present invention, there is provided a carbon nanotube device including: a substrate; an aluminum layer which is formed on the substrate and at least one side of which is spaced apart from an edge of the substrate; an insulating layer which covers an upper surface of the aluminum layer; a plurality of holes which are horizontally formed to a predetermined depth from a side of the aluminum layer that is exposed by the insulating layer on the substrate; a catalyst metal layer which is formed on the bottoms of the holes; and carbon nanotubes which are horizontally grown from the catalyst metal layer so as to protrude from the side of the aluminum layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
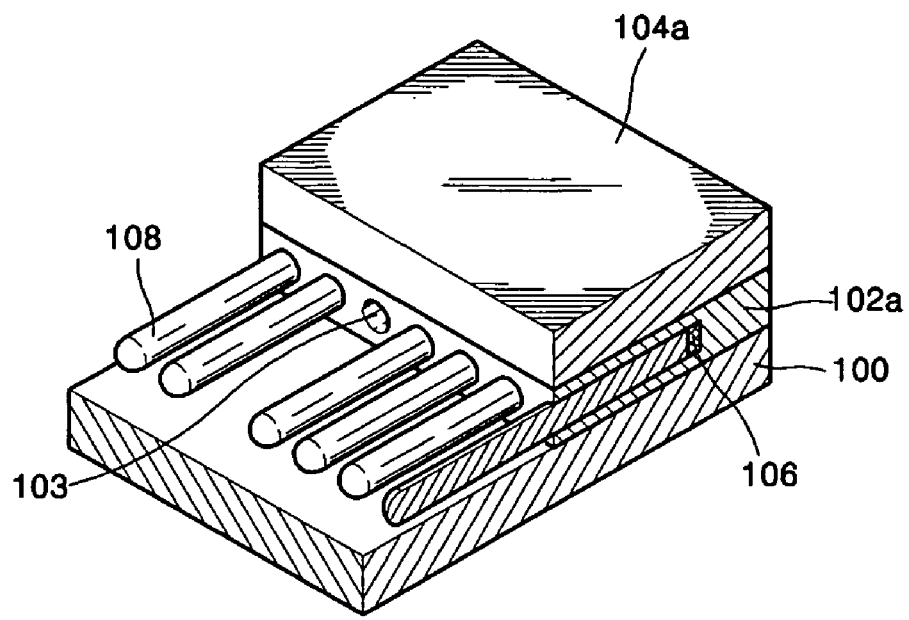
FIG. 1 is a schematic perspective view for explaining a CNT device which is manufactured using a method of horizontally growing CNTs according to an embodiment of the present invention.

Hereinafter, a method of horizontally growing CNTs, according to a preferred embodiment of the present invention, will be described in detail with reference to the attached drawings. Like reference numerals in the drawings denote like elements.

FIG. 1 is a schematic perspective view for explaining a CNT device which is manufactured using a method of horizontally growing CNTs according to an embodiment of the present invention. Referring to FIG. 1, an aluminum layer 102a having a patterned side and an insulating layer 104a are sequentially stacked on a substrate 100. A plurality of holes 103 are arranged in the patterned side of the aluminum layer 102a, and CNTs 108 protrude through the holes 103. A catalyst metal layer 106 is formed at the bottoms of the holes 103 so as to grow the CNTs 108.

FIGS. 2A through 2D are cross-sectional views for explaining a method of horizontally growing the CNTs 108, according to an embodiment of the present invention.

Figure 2A:
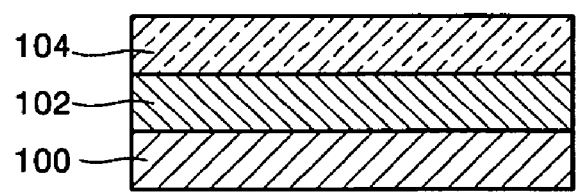
FIGS. 2A through 2D are cross-sectional views for explaining a method of horizontally growing CNTs, according to an embodiment of the present invention.

As shown in FIG. 2A, an aluminum layer 102 having a predetermined thickness is deposited on a substrate 100. The substrate 100 may be formed of quartz, glass, silicon wafer, an indium tin oxide (ITO) electrode, or the like. The aluminum layer 102 may be deposited to the thickness of about 1000–10000 Å using sputtering or e-beam evaporation.

An insulating layer 104 is deposited on the aluminum layer 102 and serves to prevent holes 103 from being formed in regions except an exposed side of an aluminum layer (102a in FIG. 2B) during an anodic oxidation process that will be described later. The insulating layer 104 may be formed of alumina, silicon oxide, or silicon nitride.

Figure 2B:
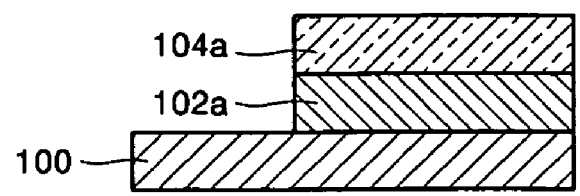

As shown in FIG. 2B, the insulating layer 104 and the aluminum layer 102 are patterned to form the aluminum layer 102a and an insulating layer 104a. The patterning process includes phenomenon and etching that are well known in a semiconductor process and thus will be omitted herein. Here, the side of the aluminum layer 102a is exposed.

Figure 2C:
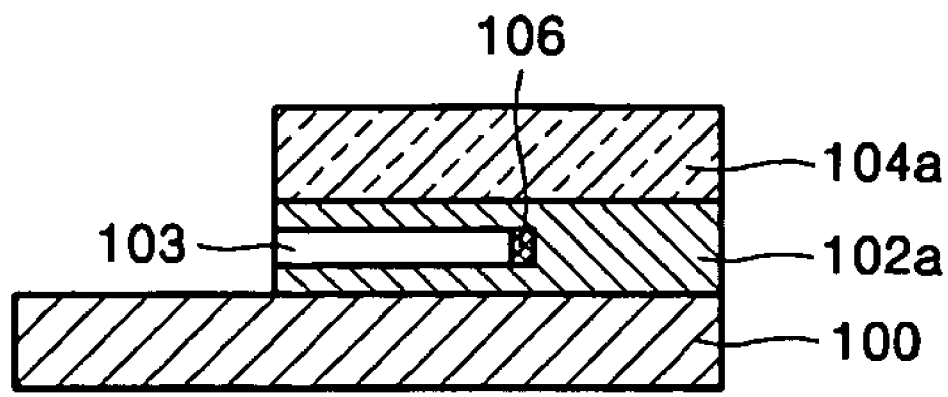

As shown in FIG. 2C and FIG. 1, a plurality of holes 103 having a predetermined length and a diameter of several tens of nanometers are formed from the exposed side of the aluminum layer 102a toward inside thereof. The holes 103 may be formed using an anodic oxidation process that is an electric and chemical etching method. In more detail, the substrate 100 on which the aluminum layer 102a has been formed is dipped into an electrolyte, and then a predetermined voltage is applied to the aluminum layer 102a and an electrode (not shown). The exposed side of the aluminum layer 102a is then anodically oxidized, and thus the holes 103 are horizontally formed from the exposed side of the aluminum layer 102a. As shown in FIG. 2C and FIG. 1, a plurality of the holes 103 are arranged in a line. However, when the thickness of the aluminum layer 102a increases, the holes 103 may be arranged in a plurality of lines. In other words, since a distance between holes 103 mainly depends on an applied voltage, the number of lines in which the holes 103 are to be arranged may be controlled by controlling the thickness of an aluminum layer 102a and an applied voltage. Also, the length of the holes 103 may be controlled by controlling the time of applying the voltage. An oxide aluminum layer (not shown) is formed around the holes 103.

Referring to FIG. 2C again, the stack structure in which the holes 103 have been formed is dipped into a sulfate, chloride, or nitrate solution of a transition metal, and then a direct current (DC) voltage, an alternating current (AC) voltage, or a pulse voltage is applied so as to electrically and chemically deposit nanoparticles of the transition metal on the bottoms of the holes 103. The transition metal may be Fe, Ni, Co, or alloys of Fe, Ni, and Co. The deposited transition metal is a catalyst metal layer 106 for growing the CNTs 108. The catalyst metal layer 106 may be formed to the thickness of about 0.5–2 nm.

Figure 2D:
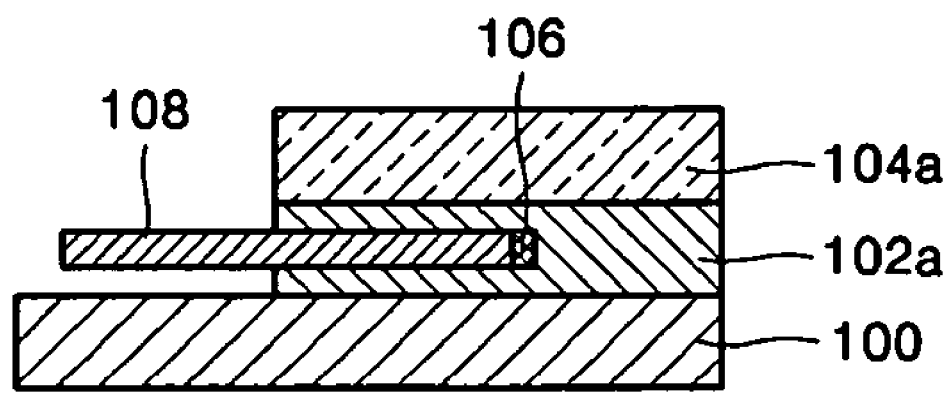
Figure 3:
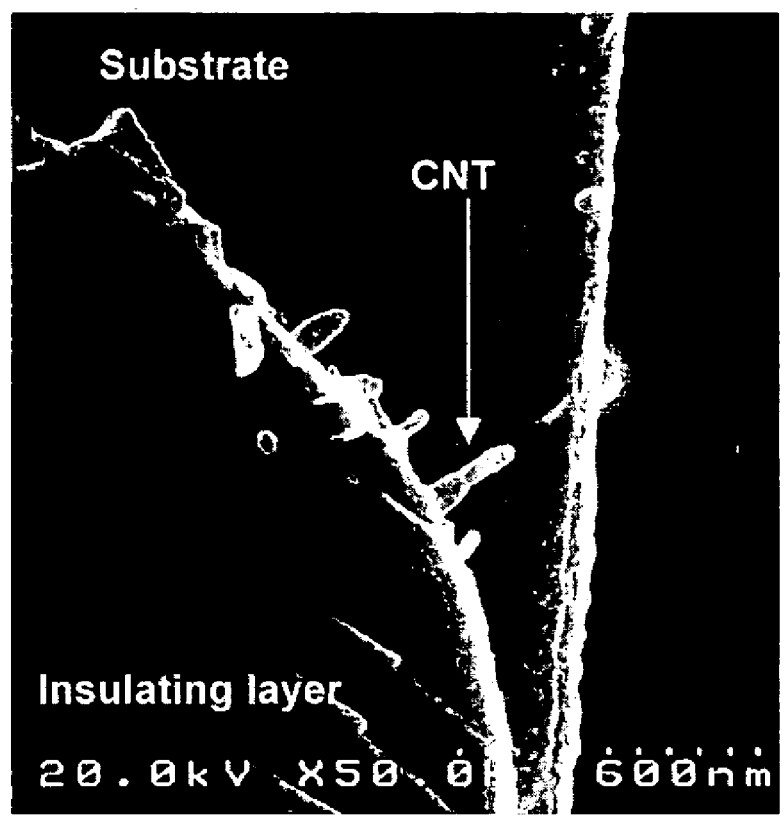
FIG. 3 is a photo observed by a scanning electron microscope (SEM) to show CNTs grown from an aluminum layer between a substrate and an insulating layer.
Figure 4:
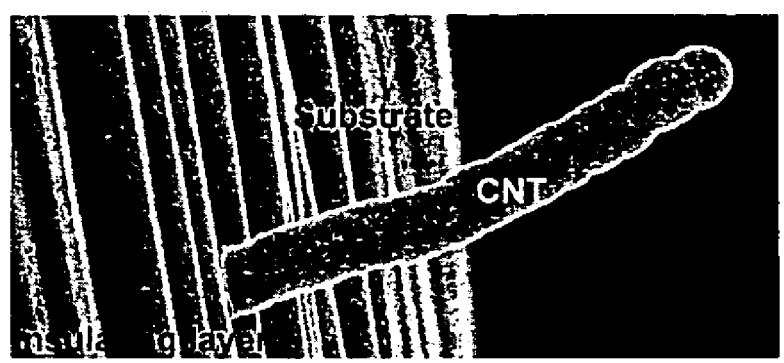
FIG. 4 is an enlarged view of a portion of the photo of FIG. 3.

As shown in FIG. 2D, the CNTs 108 are grown from the catalyst metal layer 106 through the holes 103 formed in the side of the aluminum layer 102a. The CNTs 108 may be grown using thermal chemical vapor deposition (CVD) or plasma enhanced CVD (PECVD). In more detail, the resultant structure is disposed inside a reaction chamber in which the temperature is kept at about 500–900° C., and then a gas containing carbon is injected into the reaction chamber so as to horizontally grow the CNTs 108 from the side of the catalyst metal layer 106 through the holes 103 in the side of the aluminum layer 102a. The gas containing carbon may be $CH_4$, $C_2H_2$, $C_2H_4$, $C_2H_6$, CO, or the like. The diameter of the CNTs 108 is limited to the diameter of the holes 103, i.e., about several nanometers to several tens of nanometers FIG. 3 is a photo observed by an SEM to show CNTs grown from an aluminum layer between a substrate and an insulating layer, and FIG. 4 is an enlarged view of a portion of the photo of FIG. 3. Referring to FIGS. 3 and 4, CNTs are horizontally grown to have several tens of nanometers.

In the above-described embodiment, it has been described that CNTs are horizontally grown from a patterned side of an aluminum layer on a substrate but other embodiments not limited to this can be used. In other words, holes through which the CNTs are grown can be in any direction in which a surface of the aluminum layer is exposed and thus available for patterning. Thus, the CNTs may be horizontally grown from any exposed side portion according to the pattern of the aluminum layer.

As described above, in a method of horizontally growing CNTs, according to the present invention, the diameter of holes formed in an alumina template can be controlled according to the conditions of anodic oxidation. A catalyst metal layer formed on the bottoms of the holes depends on the diameter of the holes. Thus, the CNTs can be grown to have the same diameter as the holes. As a result, the diameter of the CNTS can be controlled by controlling the diameter of the holes. Also, since the CNTs are grown along the horizontal direction of the holes, horizontal growing of the CNTs can be controlled according to a process of forming the holes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of growing carbon nanotubes, comprising:
   providing a substrate with a top surface;
   depositing an aluminum layer with a top surface, a bottom surface and side surfaces on the top surface of the substrate;
   forming an insulating layer on the top surface of the aluminum layer;
   patterning the insulating layer and the aluminum layer on the substrate so as to expose a side surface of the aluminum layer and a portion of the top surface of the substrate;
   forming a plurality of holes in the exposed side surface of the aluminum layer to a predetermined depth into the exposed side surface, wherein the plurality of holes have cross-sectional areas, and have lengths from bottoms of the holes at the deepest sideways portions of the holes to the exposed side surfaces of the aluminum layer;
   depositing a catalyst metal layer on the bottoms of the holes; and
   growing the carbon nanotubes from the catalyst metal layer from the bottoms of the holes out of the exposed side surfaces of the aluminum layer.

2. The method of claim 1, wherein the aluminum layer is deposited using sputtering or e-beam evaporation.

3. The method of claim 1, wherein the forming of the plurality of the holes comprises:
   dipping the resultant structure of the patterning of the insulating layer and the aluminum layer into a catalyst so as to be anodically oxidized.

4. The method of claim 1, wherein the depositing of the catalyst metal layer on the bottoms of the holes comprises:
applying a voltage to a solution selected from the group consisting of a metal sulfate solution, metal chloride solution, and a metal nitrate solution to form the catalyst metal layer.

5. The method of claim 1, wherein the catalyst metal layer is formed of a metal selected from the group consisting of Ni, Fe, and Co.

6. The method of claim 1, wherein the carbon nanotubes are grown from the catalyst metal layer using a gas containing carbon by a thermal chemical vapor deposition or a plasma enhanced chemical vapor deposition.

7. The method of claim 1, wherein a portion of the exposed side surface of said aluminum layer is located on the top surface of the substrate.

8. The method of claim 1, wherein the patterning of the insulating layer and the aluminum layer patterns the insulating layer and the aluminum layer to have co-planar exposed side surfaces and have top surfaces smaller than the top surface of the substrate.

9. The method of claim 1, wherein depositing the aluminum layer comprises depositing a 1,000–10,000 Å thickness layer of aluminum on the substrate, wherein the thickness of the aluminum layer limits the diameters of the plurality of holes and in turn the diameters of the carbon nanotubes.

10. The method of claim 1, wherein the length directions of plurality of holes are approximately parallel to the top surfaces of the insulating layer, the aluminum layer, and the substrate.

11. The method of claim 1, wherein the length directions of plurality of holes are approximately perpendicular to a patterned side surface of the insulating layer, and wherein the patterned side surface of the insulating layer is co-planar with the exposed side surface of the aluminum layer.

12. A method of growing carbon nanotubes, comprising:
providing a substrate;
forming an aluminum layer on a top surface of the substrate;
forming an insulating layer on a top surface of the aluminum layer, wherein the substrate, the aluminum layer and the insulating layer are stacked;
removing a portion of the insulating layer and a portion of the aluminum layer beneath the removed portion of the insulating layer to expose the top surface of the substrate, a first side portion of the insulating layer and a first side portion of the aluminum layer, wherein these first side portions are co-planar;
forming a plurality of holes with length directions formed in a sideways direction into the first side portion of the aluminum layer to a predetermined depth;
depositing a catalyst layer within the plurality of holes; and
growing carbon nanotubes from the catalyst layer.

13. The method of claim 12, wherein forming the aluminum layer comprises depositing a 1,000–10,000 Å thickness layer of aluminum on the substrate, wherein the thickness of the aluminum layer limits the diameters of the plurality of holes and in turn the diameters of the carbon nanotubes.

14. The method of claim 12, wherein the length directions of the plurality of holes are approximately parallel to the top surfaces of the insulating layer, the aluminum layer and the substrate.

15. The method of claim 12, wherein the carbon nanotubes grow in the length direction of the plurality of holes, and grow in length to extend past opening portions of the plurality of holes in the aluminum layer.

\* \* \* \* \*